(12) United States Patent
Nickel

(10) Patent No.: US 6,466,475 B1
(45) Date of Patent: Oct. 15, 2002

(54) UNIFORM MAGNETIC ENVIRONMENT FOR CELLS IN AN MRAM ARRAY

(75) Inventor: Janice H. Nickel, Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/000,652

(22) Filed: Oct. 31, 2001

(51) Int. Cl.[7] ............................ G11C 11/02; G11C 11/14
(52) U.S. Cl. ...................... 365/158; 365/171; 365/173; 365/210
(58) Field of Search ................................. 365/145, 158, 365/171, 173, 210

(56) References Cited

U.S. PATENT DOCUMENTS

| | | | |
|---|---|---|---|
| 5,748,524 A | 5/1998 | Chen et al. ................. | 365/173 |
| 5,757,695 A | 5/1998 | Shi et al. ..................... | 365/158 |
| 5,982,658 A | 11/1999 | Berg et al. .................. | 365/158 |
| 6,236,590 B1 * | 5/2001 | Bhattacharyya et al. ..... | 365/158 |
| 6,404,673 B1 * | 6/2002 | Matsui ........................ | 365/158 |

* cited by examiner

*Primary Examiner*—Son Mai
(74) *Attorney, Agent, or Firm*—Trueman H. Denny, III

(57) ABSTRACT

A magnetic memory with a uniform magnetic environment is disclosed. The magnetic memory includes dummy magnetic cells that are electrically inactive but have magnetic properties that are substantially identical to active magnetic memory cells within the magnetic memory. The active magnetic memory cells are arranged in rows and columns of an array. Some of the magnetic memory cells are positioned in an interior of the array and are surrounded on all sides by adjacent magnetic memory cells so that a cell in an interior position is exposed to a first uniform magnetic environment. Other magnetic memory cells are positioned at a perimeter of the array. The dummy magnetic cells are positioned adjacent to the magnetic memory cells at the perimeter so that the perimeter magnetic memory cells are exposed to a second uniform magnetic field that is substantially identical to the first uniform magnetic environment. As a result, the magnetic memory has a uniform magnetic environment across the entirety of the array and the switching characteristics of the magnetic memory cells within the array have a tight distribution. The dummy magnetic cells can be positioned so that the magnetic memory cells at the perimeter of the array are symmetrically surrounded by dummy magnetic cells and magnetic memory cells.

19 Claims, 14 Drawing Sheets

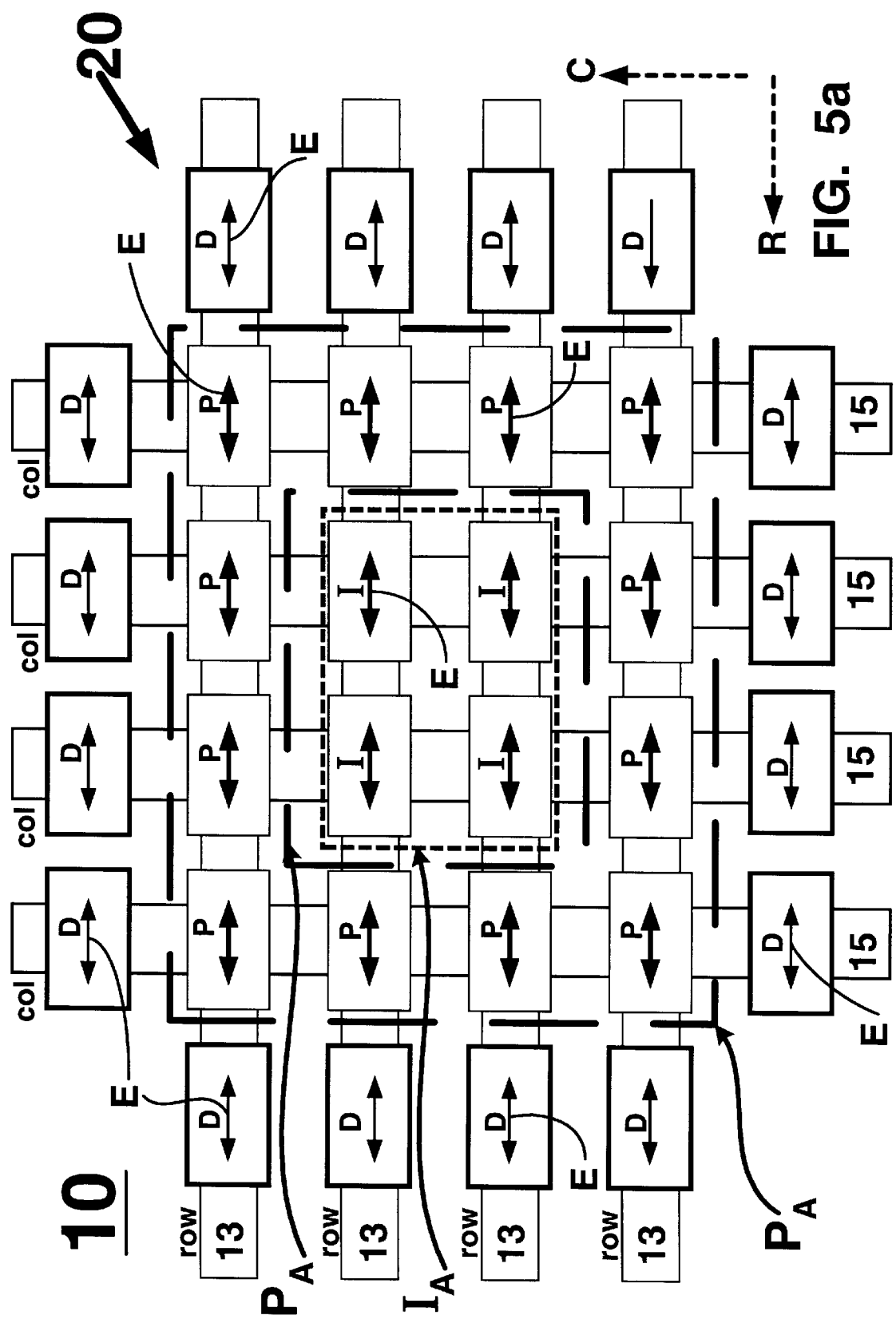

UNIFORM MAGNETIC ENVIRONMENT FOR CELLS IN AN MRAM ARRAY

FIELD OF THE INVENTION

The present invention relates generally to a uniform magnetic environment for magnetic memory cells in a Magnetic Random Access Memory. More specifically, the present invention relates to an array of magnetic memory cells in which cells in a perimeter portion of the array experience a magnetic environment that is substantially identical to a magnetic environment experienced by magnetic memory cells in an interior portion of the array.

BACKGROUND OF THE ART

Magnetic Random Access Memory (MRAM) is an emerging technology that can provide an alternative to traditional data storage devices such as fast access semiconductor memories and hard disc drives. For example, MRAM can be used to replace DRAM in a computer. Typically, MRAM comprises an array of magnetic memory cells with each cell in the array storing a bit of data (i.e. information). Each cell in the array comprises several layers of thin films with some of the layers having magnetic properties. One of those layers is a thin magnetic data layer that has an alterable orientation of magnetization. The data layer is designed so that it has two stable and distinct magnetic states. Those stable magnetic states define a binary one ("1") and a binary zero ("0"). Although the data is stored in a thin magnetic film, each memory cell in the array includes very carefully controlled magnetic, conductive, and dielectric layers.

One prominent type of MRAM cell is a spin tunneling device. The physics of spin tunneling is well understood in the MRAM art. In FIG. 1a, a prior spin tunneling memory cell 101 includes a data layer 102 that stores a bit of data as an alterable orientation of magnetization 103, a reference layer 104 in which an orientation of magnetization is pinned in a fixed direction 108, and a thin layer 106 that is positioned between the data layer 102 and the reference layer 104. The layer 106 is a dielectric layer (also called a tunnel barrier layer) in a tunneling magnetoresistance memory cell (TMR). The layer 106 could equally be a conductive layer in a giant magnetoresistance memory cell (GMR). The thickness of the tunnel barrier layer 106 is usually less than 2.0 nm. Because of shape anisotropy, It is desirable to have a width W and a height H of the prior memory cell 101 result in an aspect ratio (W/H) that is greater than 1.0 so that the alterable orientation of magnetization 103 is aligned with an easy axis e of the memory cell 101.

The relative orientations 103 and 108 of the data layer 102 and the reference layer 104 define the binary states. For example, in FIG. 1b, a binary one ("1")is stored in the data layer 102 of the prior memory cell 101 when the pinned orientation 108 and the alterable orientation 103 are parallel to each other (i.e. they point in the same direction). In contrast, a binary zero ("0") is stored in the data layer 102 of the prior memory cell 101 when the pinned orientation 108 and the alterable orientation 103 are anti-parallel to each other (i.e. they point in opposite directions). This designation could be reversed. That is, a parallel orientation can be a binary zero ("0") and an anti-parallel orientation can be a binary one ("1").

In FIG. 1c, the prior memory cell 101 is positioned intermediate between two conductors (105 and 107) that cross the memory cell 101 in an orthogonal direction (i.e. 90 degrees to each other). A row conductor 105 crosses the memory cell 101 along an easy axis (an X-axis in FIG. 1c) and a column conductor 107 crosses the memory cell 101 along a Y-axis. A bit of data is written by generating magnetic fields Hx and Hy with currents ly and lx respectively that are passed through the conductors (105, 107). The magnetic fields (Hx, Hy) interact with the data layer 102 to rotate the alterable orientation of magnetization (denoted as M in FIG. 1c) to a positive orientation (binary ("1") or a negative orientation (binary ("0") with respect to the X-axis.

The prior memory cell 101 is typically placed in a large array of identical memory cells. In FIG. 2 a prior MRAM array 100 includes a plurality of the prior memory cell 101. Each of the memory cells 101 is positioned between the aforementioned conductors (105 and 107). For instance, the conductor 105 can be a word line and the conductor 107 can be a bit line. The memory cells 101 are spaced apart by a predetermined distance Δx and Δy along an X direction and a Y direction respectively. A memory cell 101 within the array 100 is selected for a write operation by exciting the word and bit lines that cross the memory cell 101 with a current as illustrated in FIG. 1cso that the combined magnetic fields (Hx and Hy) are sufficient to switch the alterable orientation of magnetization from its present orientation to a new orientation that is indicative of the data desired to be written to the memory cell 101.

It is desirable to increase the density (i.e. the number of memory cells 101 per unit of area) of the MRAM array 100. In order to increase the density, it is necessary to reduce the size of the memory cells 101 and to reduce the distance (Δx and Δy) between the memory cells 101 so that the MRAM array 100 occupies a smaller footprint due to a reduction in area resulting from the reduced cell size and the reduced distance between cells.

FIG. 2 is a representation of an MRAM array 100 composed of memory cells 101. This is for illustration purposes, the actual size of the array 100 can be different than shown. In FIG. 2, the memory cells 101 are spaced apart by the distance Δx along the direction of the row conductors 105 and by the distance Δy along the direction of the column conductors 107. Each memory cell 101 has a switching field Hc that contributes to a switching characteristic for that cell 101. That is, the switching characteristic is a magnitude of the combined magnetic fields (Hx and Hy) at which the cell 101 will switch its alterable orientation of magnetization 103 in response to write currents flowing in the row and column conductors (105, 107) that cross the cell 101. Furthermore, each memory cell 101 comprises a magnetic bit that generates a magnetic field. The combined magnetic fields from all of the memory cells 101 in the array 100 creates a magnetic environment. The magnetic environment experienced by an individual memory cell 101 will depend on the position of that cell 101 within the array 100. Accordingly, some of the memory cells (denoted 101i) have an interior position (see dashed line i) within the array 100 while other memory cells (denoted 101p) have a perimeter position within the array 100 (i.e a position that is not within the dashed line i).

One disadvantage of the prior MRAM array 100 is that at a certain point the distances (Δx and Δy) between the memory cells 101 becomes small enough such that an individual memory cell 101 is affected by the magnetic environment generated by its neighboring memory cells 101. This magnetic environment effects the switching characteristics of the individual memory cell 101. Ideally, it is desirable to have a tight distribution of switching characteristics (i.e. a lowσon the coercivity distribution) among all the memory cells 101 within the array 100. However, the switching characteristics varies across the array 100 depending on whether or not specific memory cell 101 has the interior position or the perimeter position. This increases the distribution of switching characteristics in the array 100. The switching characteristics vary because the magnetic environment varies across the array 100.

In FIG. 2, a memory cell 101i having the interior position (e.g. at the center of the array 100) is symmetrically surrounded (see dashed arrows S) by neighboring memory cells. The magnetic environment experienced by the memory cell 101i is different than the magnetic environment experienced by memory cells 101p and 101p' that are positioned at the perimeter positions and that are non-symmetrically surrounded (see dashed arrows a) by neighboring memory cells. Accordingly, the switching characteristics of the memory cells 101p and 101p' are different than those of the memory cell 101i.

In FIG. 4, the memory cell 101p' has the perimeter position at the end of a row and column conductor (105, 107). The memory cells 101 have magnetic poles (+and−) that contribute to the aforementioned magnetic environment and the easy axis 103 of the memory cells 101 is aligned with the row conductor 105. The dashed arrows a indicate magnetic field interactions among the memory cells 101. The memory cell 101p' magnetically interacts with only three memory cells and the positive pole+of the memory cell 101p has no matching negative pole−because it is at the end of the row and column conductor (105, 107). That mismatch results in a different switching characteristic for the memory cell 101p' than for 101i or 101p. Because the magnetic field along the easy axis 103 (i.e. along the row conductor 105) is stronger than the magnetic field along the column conductor 107, the switching characteristics of the memory cell 101p' is more adversely affected than that of the memory cell 101p that is positioned immediately to the right of the memory cell 101p'.

Consequently, as the distance between memory cells 101 decreases the interaction between the individual cells 101 increases. In FIG. 3, as the distance $\Delta x$ decreases the switching field of the memory cells 101 increases substantially when $\Delta x$ is below $0.30\,\mu m$. Therefore, variations in the magnetic environment across the array 100 result in the switching characteristics that also vary across the array 100. Those variations in the switching characteristics are greater for the memory cells 101 having the perimeter positions.

Therefore, a need exists for a MRAM array with a uniform magnetic environment for all memory cells within the array. There is also a need to provide a magnetic environment for memory cells having the perimeter positions that is substantially identical to a magnetic environment for memory cells having the interior positions. Finally, there is a need for an MRAM array in which there is a tight distribution of switching characteristics among all of the memory cells in the array.

SUMMARY OF THE INVENTION

The MRAM with a uniform magnetic environment of the present invention solves the aforementioned problems. The aforementioned problems with variations in the switching characteristics are solved by placing electrically inactive dummy magnetic cells in positions that are adjacent to the perimeter memory cells such that the magnetic environment experienced by the perimeter memory cells is substantially identical to that of the memory cells having the interior positions.

The dummy magnetic cells can be formed using same layers of materials that are used to form an electrically active memory cell in an MRAM array. The dummy magnetic cells can be positioned so that an easy axis of the dummy magnetic cells is aligned with an easy axis of the active memory cells and so,that a magnetic pole of the perimeter memory cell has a complementary matching pole on the dummy magnetic cell. Moreover, the dummy magnetic cells can be positioned so that a perimeter memory cells is symmetrically surrounded by a combination of adjacent magnetic cells and dummy magnetic cells.

Broadly, the present invention is embodied in a magnetic memory with a uniform magnetic environment. The magnetic memory includes a plurality of magnetic memory cells arranged in rows and columns to define an array having interior positions and perimeter positions. The magnetic memory cells are positioned at either one of the interior or perimeter positions. Each magnetic memory cell includes an easy axis and is crossed by a row conductor and a column conductor.

The magnetic memory cells that are positioned at the interior positions are exposed to a first uniform magnetic environment created by adjacent magnetic memory cells. A plurality of electrically inactive dummy magnetic cells (i.e. they don't store data and are not read or written to) having an easy axis are positioned adjacent to one or more of the magnetic memory cells at the perimeter positions.

The magnetic memory cells at the perimeter position are exposed to a second uniform magnetic environment created by adjacent magnetic memory cells and adjacent dummy magnetic cells. The second uniform magnetic environment is substantially equal to the first uniform magnetic environment. Consequently, the magnetic memory has a uniform magnetic environment across the entirety of the array with a resulting uniformity of switching characteristics among the magnetic memory cells within the array (i.e. among the magnetic memory cells in the perimeter and interior positions).

In one embodiment of the present invention, the first uniform magnetic environment affects a magnitude of a switching field generated by the magnetic memory cells that have the interior position and adjacent magnetic memory cells. The second uniform magnetic environment also affects a magnitude of a switching field generated by the magnetic memory cells that have the perimeter position, the dummy magnetic cells, and the adjacent magnetic memory cells in substantially the same manner as the first uniform magnetic field.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1b depicts logic states of a data layer of the prior spin dependent tunneling memory cell of FIG. 1a.

FIGS. 5a and 5b are schematic illustrations of an MRAM array with a uniform magnetic environment according to the present invention.

DETAILED DESCRIPTION

Figure 1A:
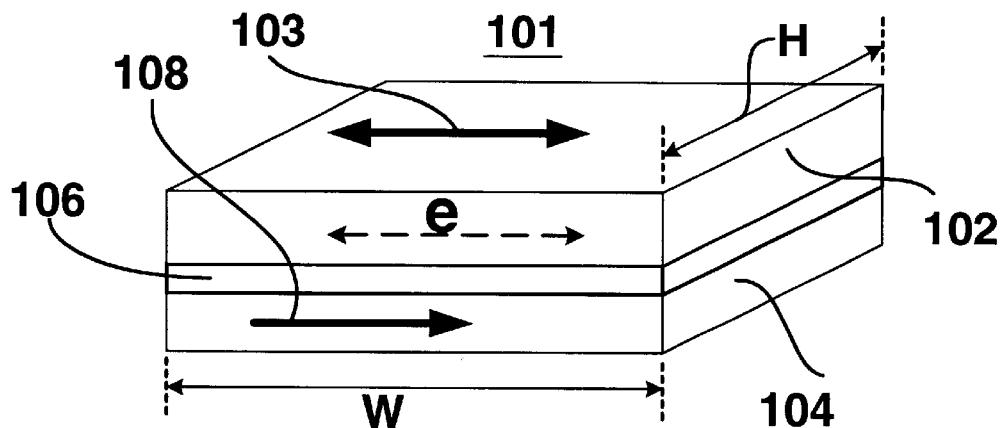
FIG. 1a is a profile view of a prior spin dependent tunneling memory cell.
Figure 1B:
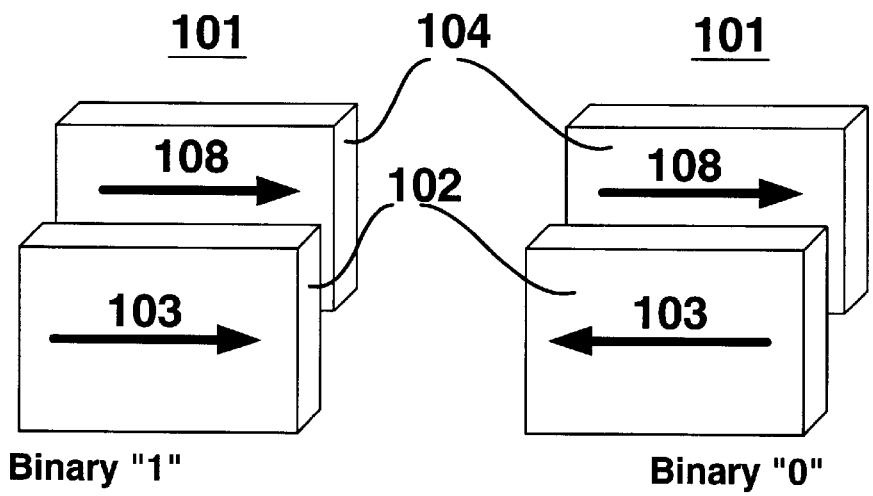
Figure 1C:
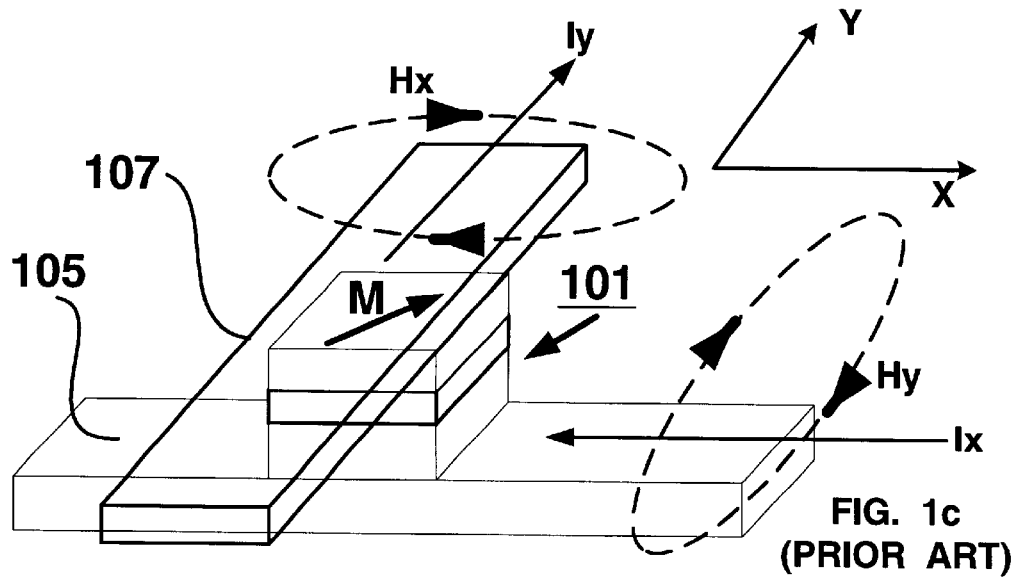
FIG. 1c is a schematic depicting row and column conductors for writing data to the prior spin dependent tunneling memory cell.
Figure 2:
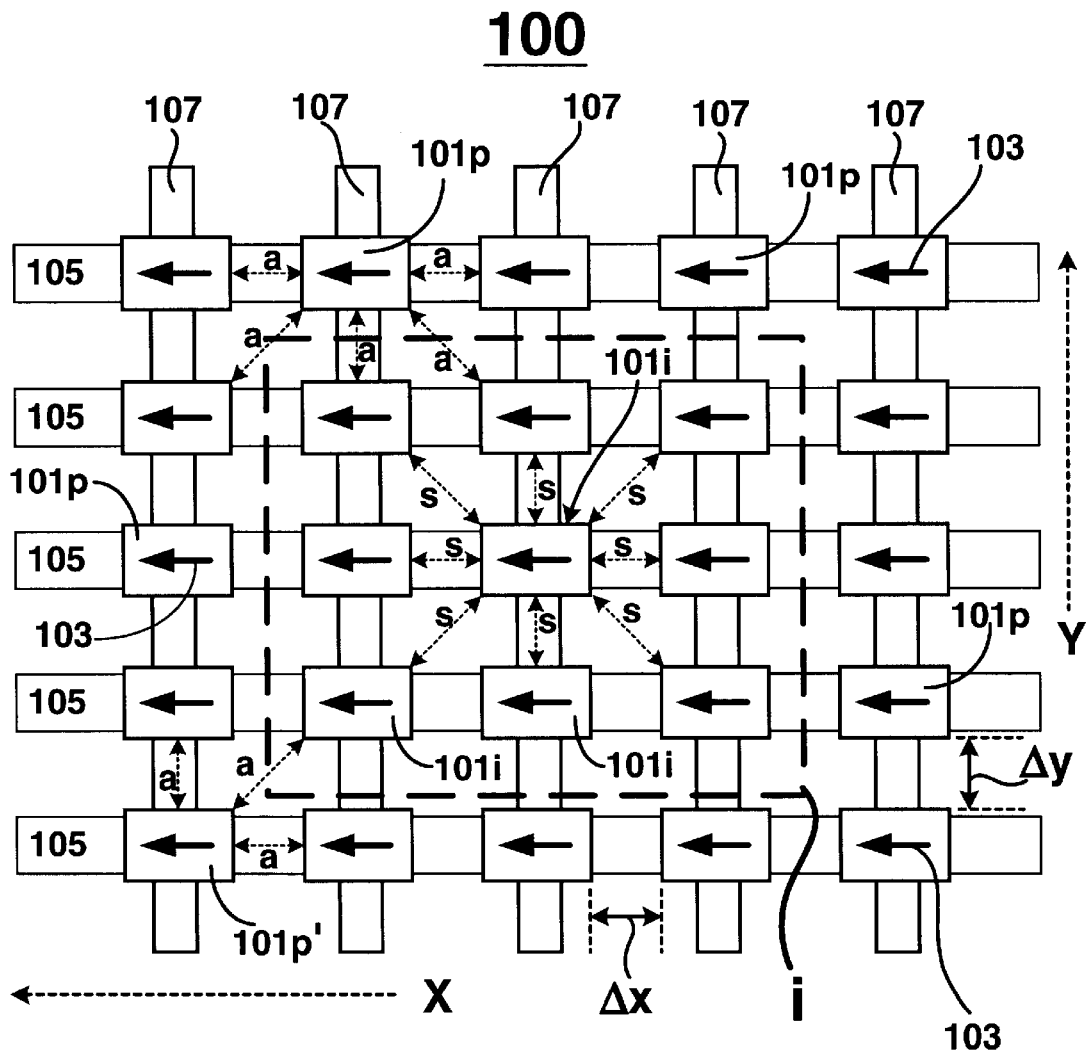
FIG. 2 is a schematic view of the arrangement of FIG. 1c configured to define a prior MRAM array.
Figure 3:
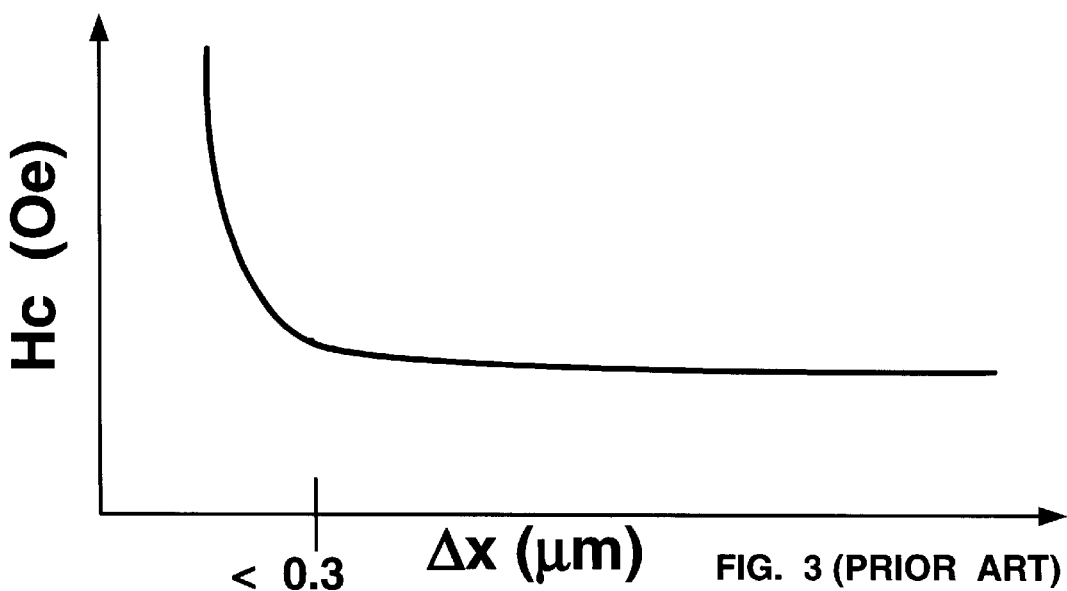
FIG. 3 is graph depicting an increase in switching field with decreasing distance between the prior spin dependent tunneling memory cells in the prior MRAM array.
Figure 4:
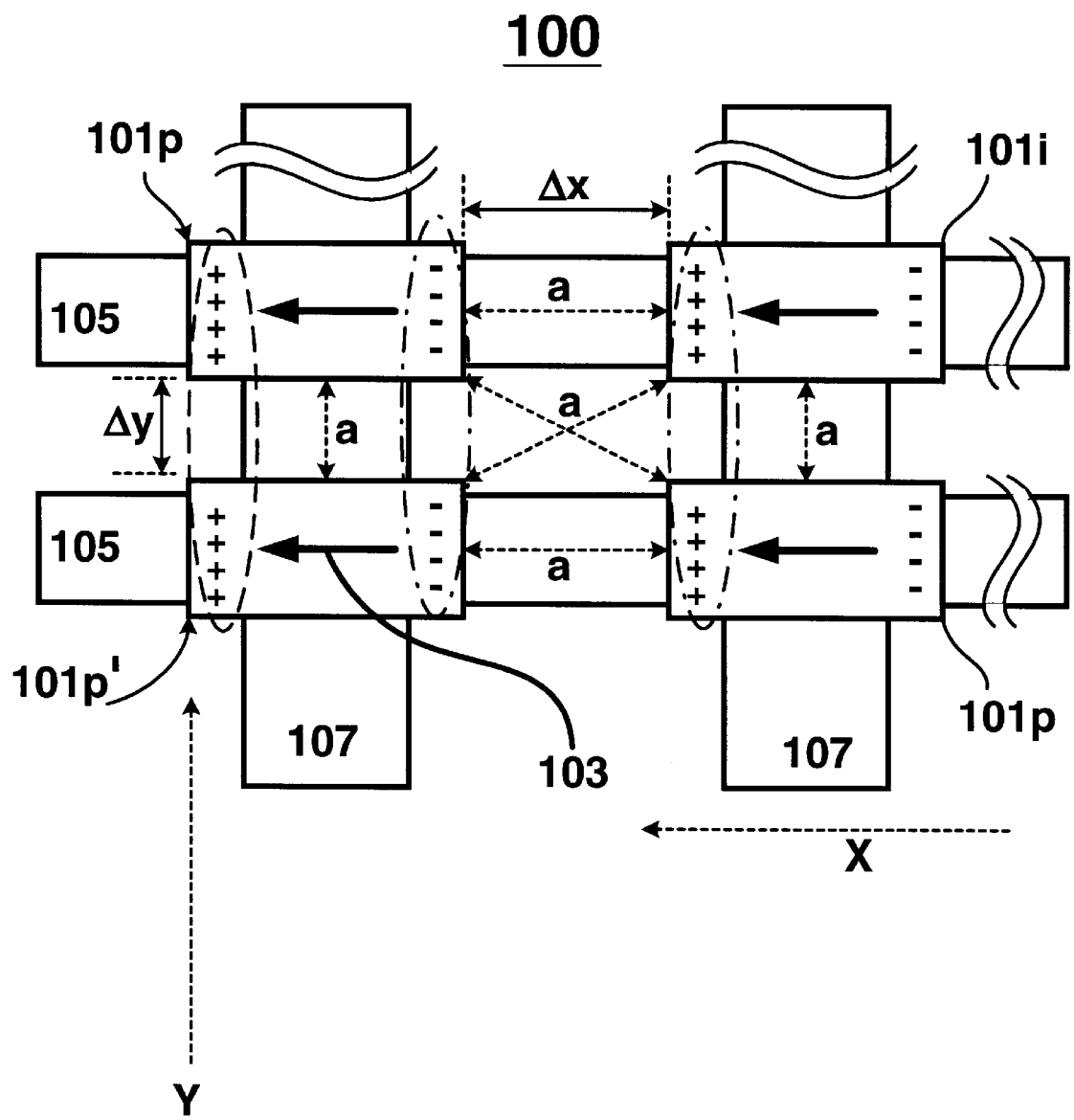
FIG. 4 is a schematic illustrating a non-uniform magnetic field environment for prior memory cells having a perimeter position within the prior MRAM array.

In the following detailed description and in the several figures of the drawings, like elements are identified with like reference numerals.

As shown in the drawings for purpose of illustration, the present invention is embodied in a magnetic memory with a uniform magnetic environment. The magnetic memory includes a plurality of magnetic memory cells that have an easy axis and are arranged in a plurality of rows and columns to define an array. The magnetic memory cells are positioned at either an interior position or a perimeter position within the array. A row conductor and a column conductor cross the magnetic memory cells of the array in a row direction and a column direction respectively. The magnetic memory cells that are positioned at the interior position are exposed to a first uniform magnetic environment created by adjacent magnetic memory cells.

The magnetic memory also includes a plurality of dummy magnetic cells that have an easy axis and are positioned adjacent to a selected one or more of the magnetic memory cells that are positioned at the perimeter position. Consequently, the magnetic memory cells that are positioned at the perimeter position are exposed to a second uniform magnetic environment created by adjacent magnetic memory cells and adjacent dummy magnetic cells. The second uniform magnetic environment is substantially equal to the first uniform magnetic environment so that the magnetic memory cells within the entirety of the array are subjected to a uniform magnetic environment. The uniform magnetic environment address the aforementioned problems with variations in switching field among the magnetic memory cells within the array.

The magnetic memory cells and the dummy magnetic cells of the present invention can be made from several layers of thin materials known in the MRAM art for forming any magnetic memory system including but not limited to tunneling magnetoresistance (TMR) magnetic memory cells, giant magnetoresistance (GMR) magnetic memory cells, TMR or GMR magnetic memory cells that include a soft reference layer, single TMR magnetic memory cells, and double TMR magnetic memory cells. The dummy magnetic cells differ from the magnetic memory cells in that the magnetic memory cells are crossed by both the row and column conductors such that magnetic fields generated by currents flowing in the row and column conductors can cooperatively interact with a data layer of the magnetic memory cells to write data to a selected magnetic memory cell. The row and column conductors can also be used to sense the state of orientation of magnetization of the data layer in order read a bit of data stored in a selected magnetic memory cell. In sharp contrast, the dummy magnetic cells of the present invention can be crossed by only the row conductor, by only the column conductor, not crossed by either one of the row and column conductors, or crossed by either one of the row or column conductor and electrically isolated from that conductor by a dielectric material.

Figure 5B:
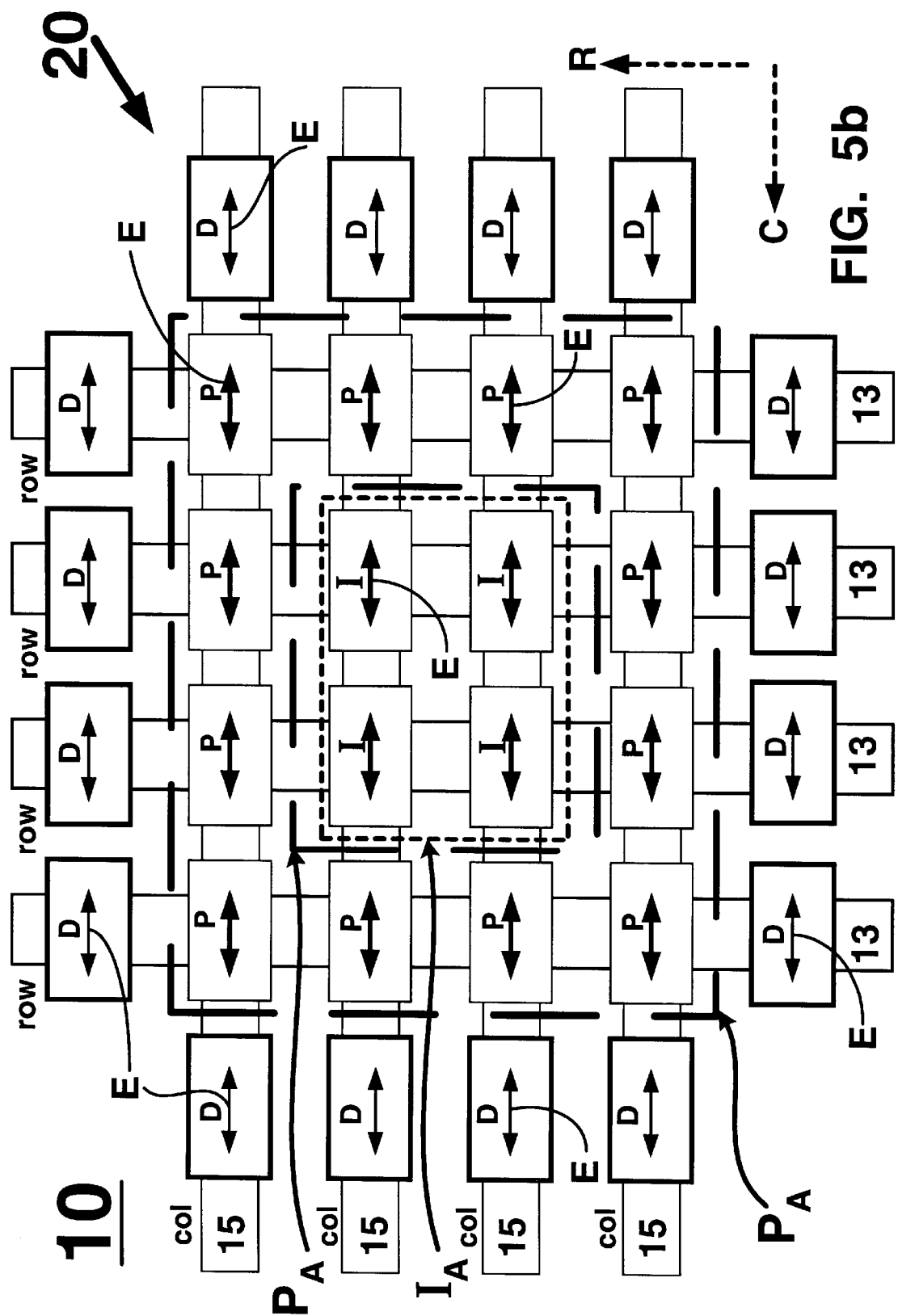

In FIGS. 5a and 5b, a magnetic memory 10 with a uniform magnetic environment includes a plurality of magnetic memory cells (denoted as I and P) that are arranged into rows and columns (see row and col in FIGS. 5a and 5b) to define an array 20. The magnetic memory cells I are positioned at an interior position within the array 20 (as denoted by a dashed line $I_A$ that encircles the memory cells I) or the magnetic memory cells P are positioned at a perimeter position within the array 20 (as denoted by a heavy dashed lines $P_A$). That is, the magnetic memory cells P are positioned outside the dashed line $I_A$ and within the dashed lines $P_A$. The magnetic memory cells (I, P) include an easy axis E. The size of the array 20 as depicted herein is for purposes of illustration only and arrays of any size may be used.

A row conductor 13 and a column conductor 15 cross the magnetic memory cells (I, P) in a row direction R and a column direction C respectively. Typically, the row and column conductors (13, 15) cross the magnetic memory cells (I, P) in an orthogonal direction (i.e. the conductor are positioned 90 degrees to each other).

The magnetic memory cells I that have the interior position $I_A$ are exposed to a first uniform magnetic environment that is created by adjacent magnetic memory cells (I, P). A plurality of dummy magnetic cells D having an easy axis E are positioned adjacent to one or more of the magnetic memory cells P having the perimeter position $P_A$. The magnetic memory cells having the perimeter position $P_A$ are exposed to a second uniform magnetic environment created by adjacent magnetic memory cells (I, P) and adjacent dummy magnetic cells D. The second uniform magnetic environment is substantially equal to the first uniform magnetic environment so that the active memory cells that comprise the magnetic memory 10 have a similar magnetic environment that is uniform across the entirety of the array 20.

In one embodiment of the present invention, the first uniform magnetic field affects a magnitude of a switching field that is generated by the magnetic memory cells I that have the interior position $I_A$ and magnetic memory cells (I, P) that are adjacent to those magnetic memory cells I that have the interior position $I_A$. Similarly, the second uniform magnetic environment also affects a magnitude of a switching field-generated by the magnetic memory cells P having the perimeter position $P_A$, the dummy magnetic cells D, and magnetic memory cells (I, P) that are adjacent to those magnetic memory cells P that have the perimeter position $P_A$. The second uniform magnetic environment affects the magnitude of the switching field generated by the magnetic memory cells P having the perimeter position $P_A$ in substantially the same manner as the first uniform magnetic field affects the magnitude of the switching field that is generated by the magnetic memory cells I that have the interior position $I_A$. As a result, the switching characteristics of the magnetic memory cells (I, P) throughout the array 20 are substantially identical and there is a tight distribution of switching characteristics among the magnetic memory cells (I, P).

In FIGS. 5a and 5b, the easy axes E of the magnetic memory cells (I, P) and the dummy magnetic cells D can be substantially colinear with one another. That is, the easy axes E can be aligned in substantially the same direction.

In one embodiment of the present invention, as illustrated in FIG. 5a, the easy axes E of the magnetic memory cells (I, P) and the dummy magnetic cells D are substantially colinear with the row direction R.

In another embodiment of the present invention, also illustrated in FIG. 5a, the dummy magnetic cells D can be positioned adjacent to the magnetic memory cells P that are positioned on the rows (i.e. at the end of the row conductor 13) and that have the perimeter positions $P_A$. The easy axes E of the magnetic memory cells P and the dummy magnetic cells D are substantially colinear with the row direction R.

Figure 7:
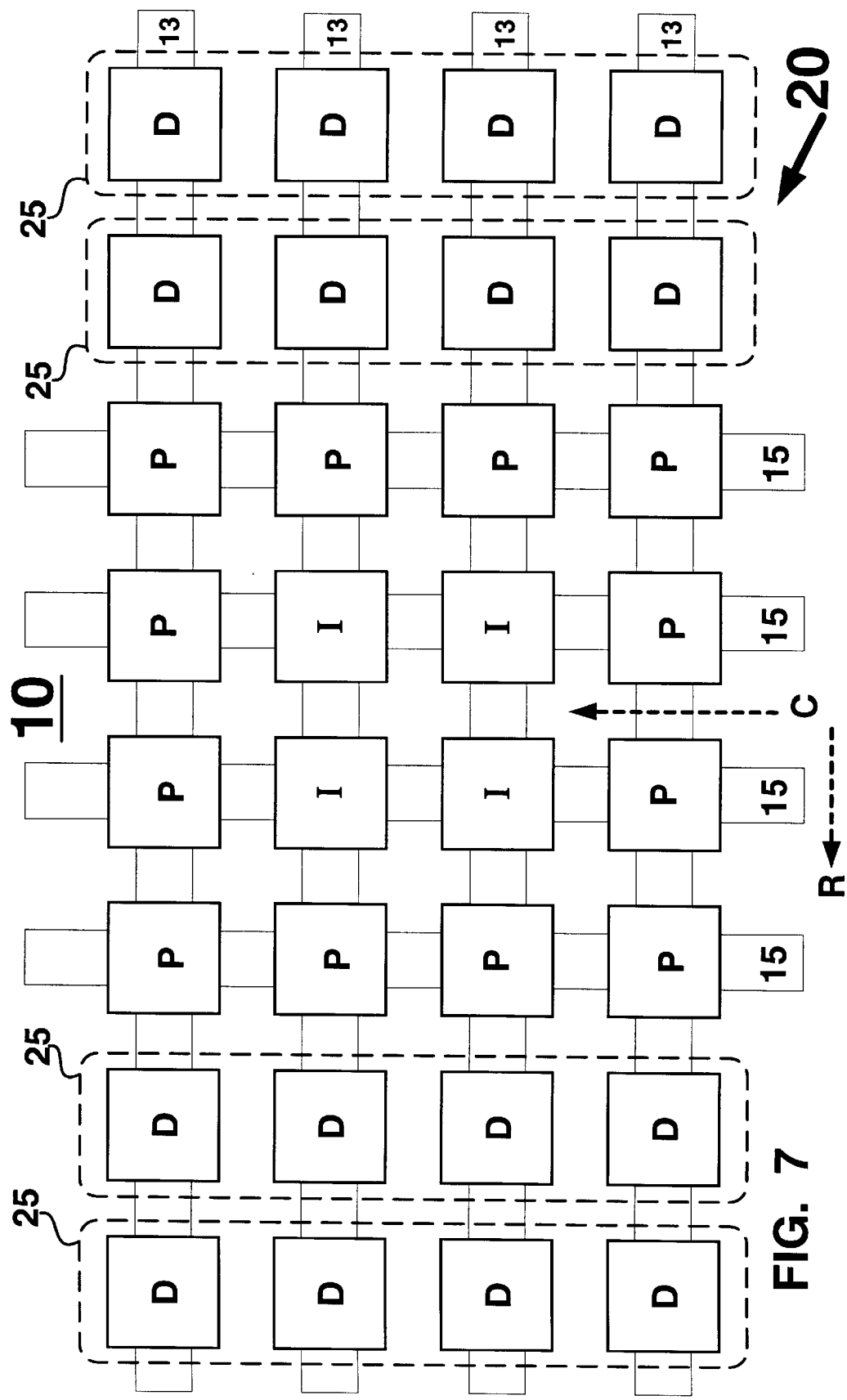
FIG. 7 is a schematic illustrating dummy magnetic cells arranged in a row bank according to the present invention.

In yet another embodiment of the present invention, as illustrated in FIG. 7, the dummy magnetic cells D are arranged in at least one row bank 25 (two are shown) and the dummy magnetic cells D within the row bank 25 are paired with the magnetic memory cells P that have the perimeter positions $P_A$. Therefore, in FIG. 7, the magnetic memory cells P that have the perimeter positions $P_A$ and that are also at the end of the row conductor 13 are paired with the dummy magnetic cells D in an adjacent row bank 25. For instance, more than one row bank 25 may be required so that the second uniform magnetic environment is substantially equal to the first uniform magnetic environment as was described above. Although not shown in FIG. 7, the easy axes E of the magnetic memory cells P and the dummy magnetic cells D are substantially colinear with the row direction R. The dummy magnetic cells D in the row banks 25 are crossed by the row conductor 13 but are not crossed by the column conductor 15. As was mentioned above, the dummy magnetic cells D can be crossed by only the row conductor 13, by only the column conductor 15, not crossed by either one of the row and column conductors (13, 15), or crossed by either one or both of the row or column conductor (13, 15) and electrically isolated from one or both of those conductors (13, 15) by a dielectric material as will,be described below.

In one embodiment of the present invention, as illustrated in FIG. 5b, the easy axes E of the magnetic memory cells (I, P) and the dummy magnetic cells D are substantially colinear with the column direction C.

In another embodiment of the present invention, also illustrated in FIG. 5b, the dummy magnetic cells D can be positioned adjacent to the magnetic memory cells P that are positioned on the columns (i.e. at the end of the column conductor 15) and that have the perimeter positions $P_A$. The easy axes E of the magnetic memory cells P and the dummy magnetic cells D are substantially colinear with the column direction C.

Figure 8:
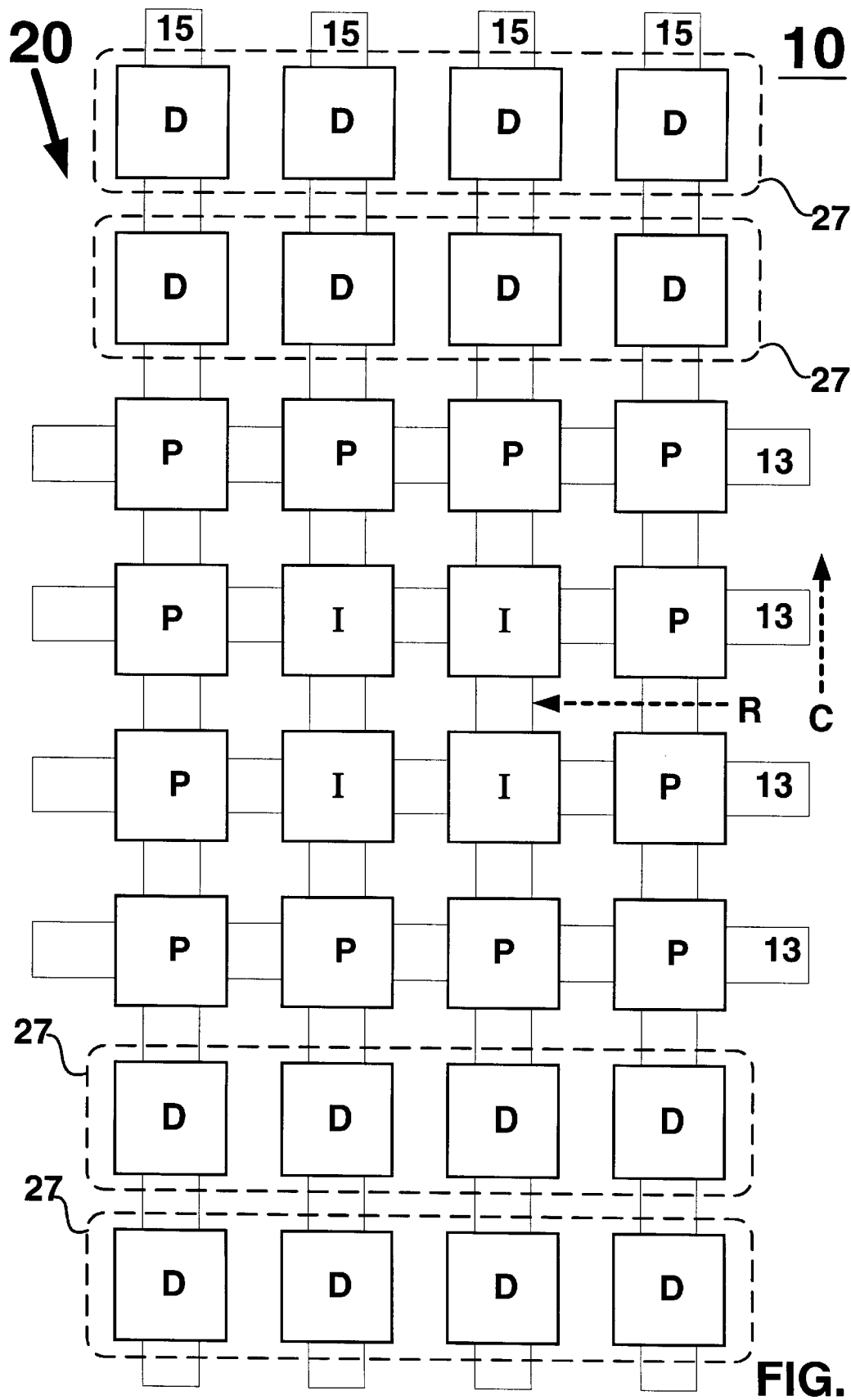
FIG. 8 is a schematic illustrating dummy magnetic cells arranged in a column bank according to the present invention.

In yet another embodiment of the present invention, as illustrated in FIG. 8, the dummy magnetic cells D are arranged in at least one column bank 27 (two are shown) and the dummy magnetic cells D within the column bank 27 are paired with the magnetic memory cells P that have the perimeter positions $P_A$. Therefore, in FIG. 8, the magnetic memory cells P that have the perimeter positions $P_A$ and that are also at the end of the column conductor 15 are paired with the dummy magnetic cells D in an adjacent column bank 27. As was discussed above, more than one column bank 27 may be required so that the second uniform magnetic environment is substantially equal to the first uniform magnetic environment. Although not shown in FIG. 8, the easy axes E of the magnetic memory cells P and the dummy magnetic cells D are substantially colinear with the column direction C. The dummy magnetic cells D in the column banks 27 are crossed by the column conductor 15 but are not crossed by the row conductor 13. The dummy magnetic cells D can be crossed by only the row conductor 13, by only the column conductor 15, not crossed by either one of the row and column conductors (13, 15), or crossed by either one of the row or column conductor (13, 15) and electrically isolated from either one or both of those conductors (13, 15) by a dielectric material as will be described below.

Figure 13:
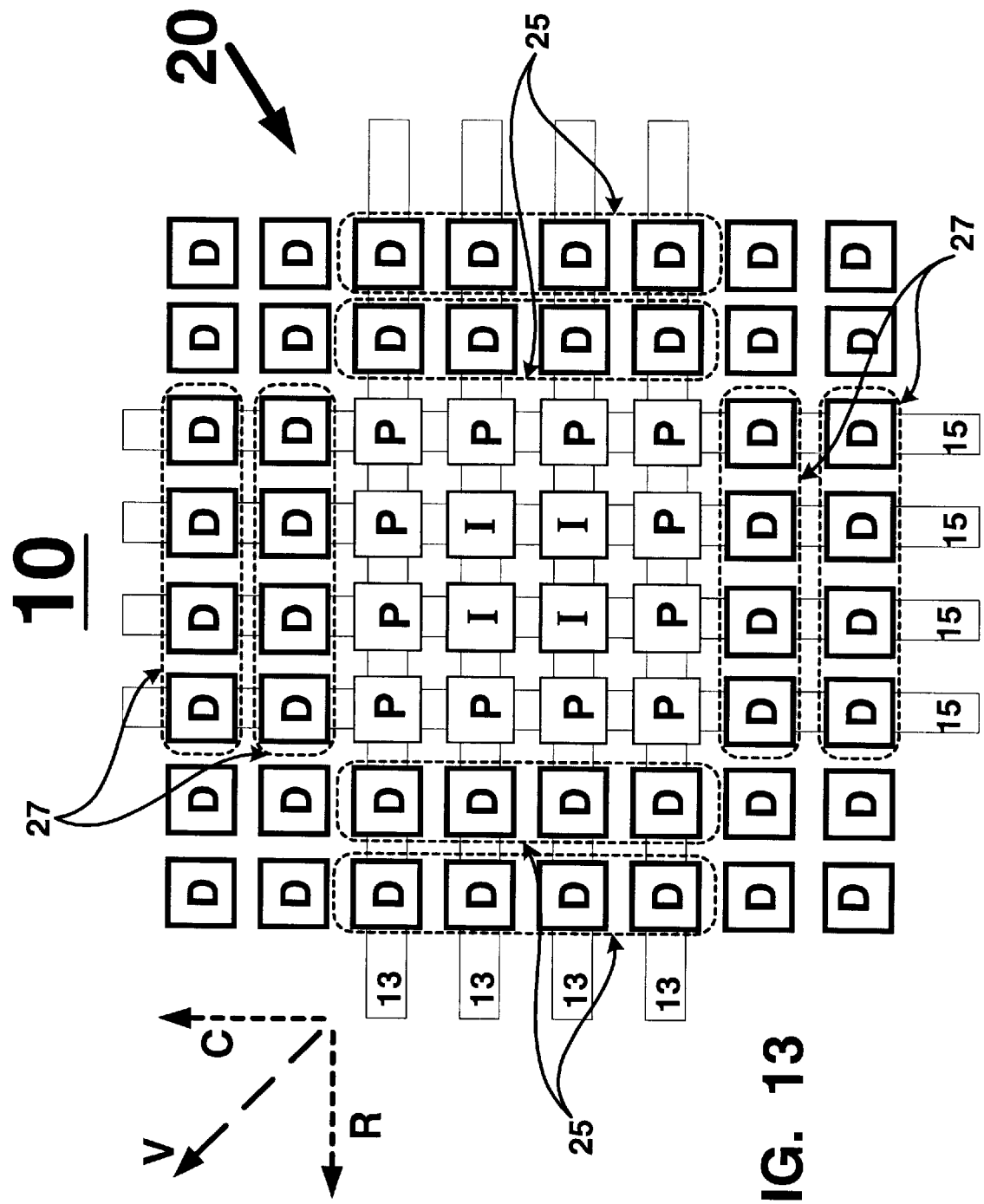
FIG. 13 is a schematic illustrating dummy magnetic cells arranged in a plurality of row and column banks according to the present invention.

The magnetic memory 10 can include a plurality of the above mentioned row and column banks (25, 27) positioned around the array 20 as illustrated in FIG. 13. Additional dummy magnetic cells D that are not within the row and column banks (25, 27) can be positioned around the array 20 to effectuate a symmetrical surrounding of some or all of the magnetic memory cells P that have the perimeter positions $P_A$ as will be discussed below in reference to FIGS. 9 and 10.

Figure 9:
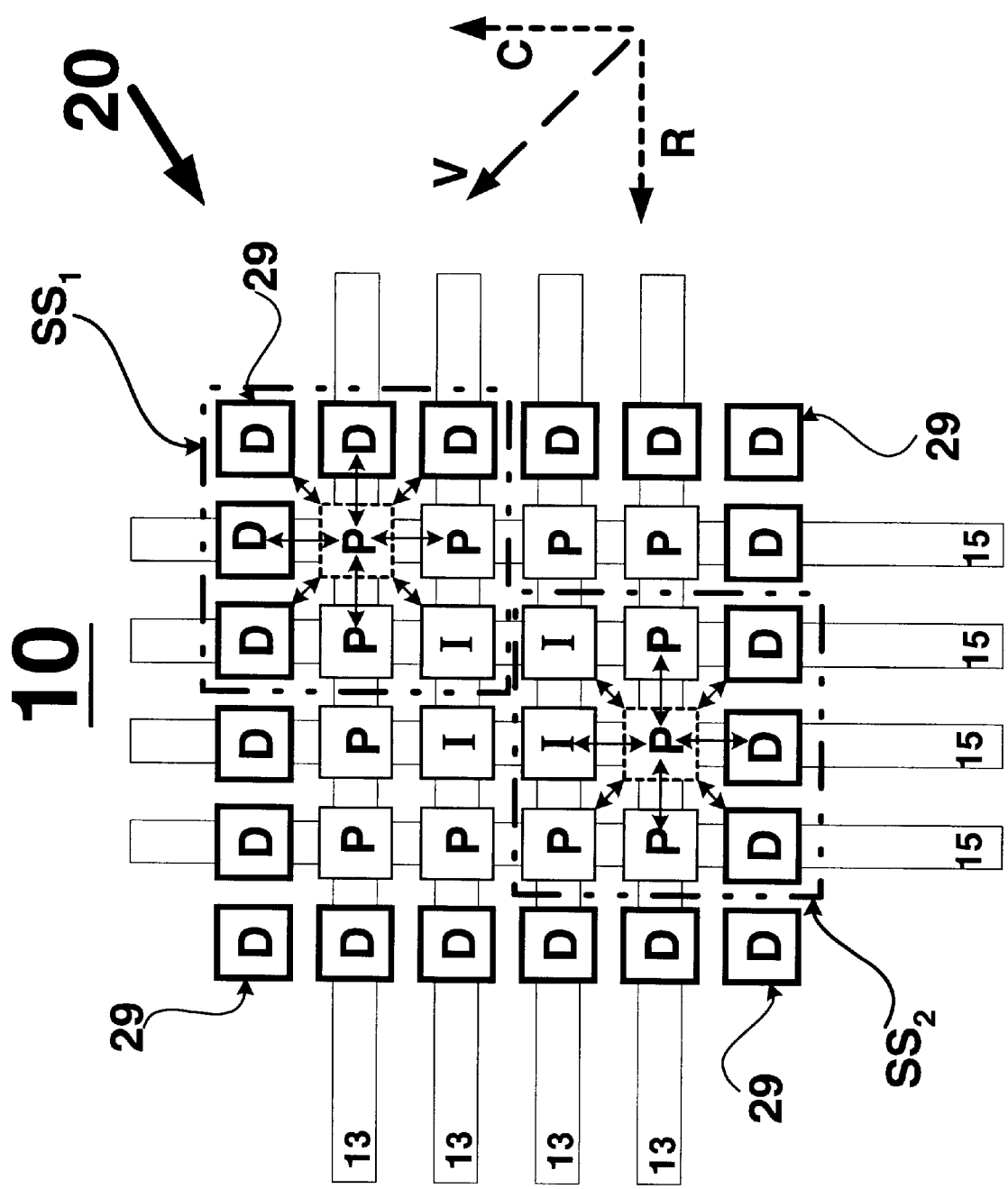
FIG. 9 is a schematic illustrating perimeter memory cells that are symmetrically surrounded according to the present invention.

In FIG. 9, the dummy magnetic cells D are positioned within the array 20 so that the magnetic memory cells P that have the perimeter positions $P_A$ are symmetrically surrounded by the dummy magnetic cells D and by adjacent magnetic memory cells (I, P). That is, all of the magnetic memory cells P that have the perimeter positions $P_A$ are symmetrically surrounded by one or more of the dummy magnetic cells D and by one or more of the magnetic memory cells (I, P).

For example, in FIG. 9, in the upper right hand corner of the array 20, the magnetic memory cell P that has the perimeter position $P_A$ (i.e. it is at the end of a row and a column) is symmetrically surrounded (see dashed outline SS, and the double arrows between adjacent cells D, I, P) by five of the dummy magnetic cells D, two of the magnetic memory cells P (also having the perimeter position $P_A$), and one magnetic memory cell I. An arrow 29 depicts the dummy magnetic cells D that are not positioned on a row or a column and are not crossed by the row and column conductors (13, 15). Those dummy magnetic cells D are positioned diagonally with respect to the magnetic memory cells P that are positioned at the corners of the perimeter of the array 20. Those dummy magnetic cells D (i.e. 29) provide the symmetry necessary to accomplish the above mentioned symmetrical surrounding $SS_1$, of all the magnetic memory cells P that are positioned at the corners of the array 20.

In contrast, the magnetic memory cell P that has the perimeter position $P_A$ in a bottom left hand portion of the array 20 is symmetrically surrounded (see dashed outline $SS_2$ and the double arrows between adjacent cells D, I, P) by three of the dummy magnetic cells D, three of the magnetic memory cells P (also having the perimeter position $P_A$), and two of the magnetic memory cells I.

Figure 12:
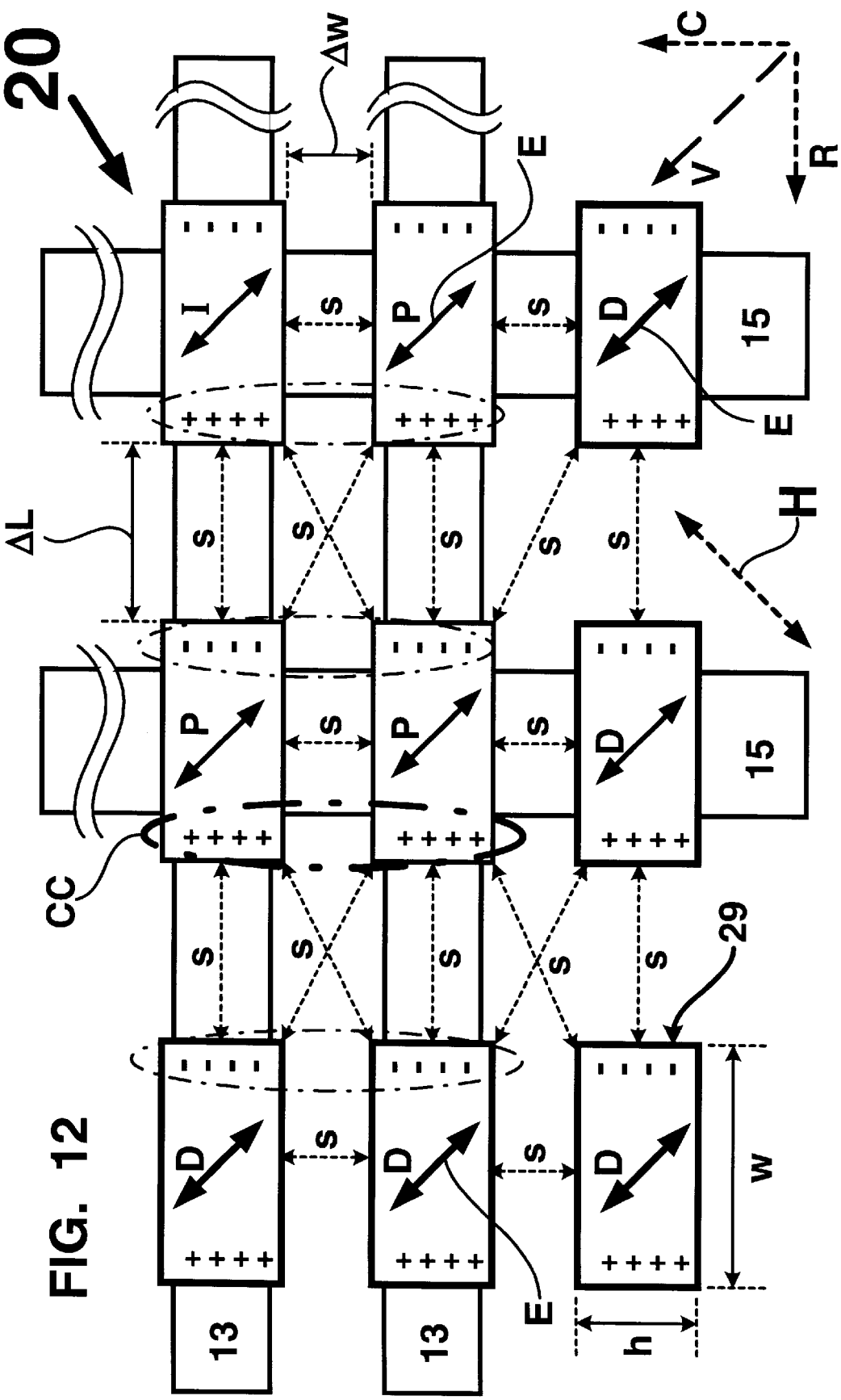
FIG. 12 is a schematic illustrating dummy magnetic cells and active magnetic memory cells that have an easy axis that is colinear with a vector according to the present invention.

In FIG. 9, the easy axes E (not shown) of the dummy magnetic cells D and the magnetic memory cells (I, P) can be colinear with either one of the row or column directions (R, C). Alternatively, the easy axes E (not shown) of the dummy magnetic cells D and the magnetic memory cells (I, P) can be substantially colinear with a vector V (see FIG. 12). The vector V can be an angle measured with respect to the row or column directions (R, C) or it can be an angle measured with respect to any preselected point of origin relative to the array 20.

Figure 10:
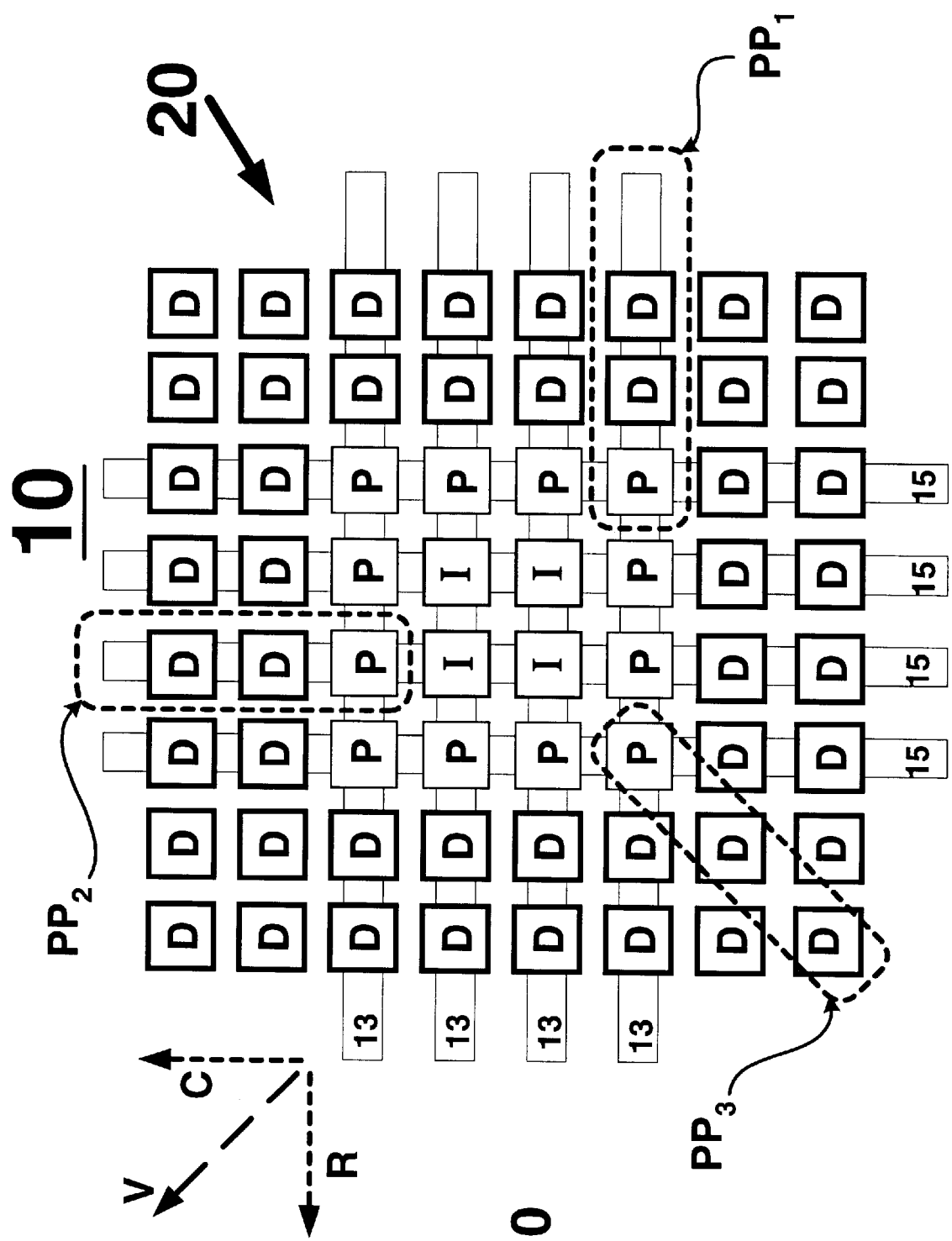
FIG. 10 is a schematic illustrating perimeter memory cells that are paired with dummy magnetic cells according to the present invention.

In FIG. 10, a selected one or more of the magnetic memory cells P that have the perimeter positions $P_A$ are paired with at least two of the dummy magnetic cells D. The paring of the magnetic memory cells P that have the perimeter positions $P_A$ with at least two of the dummy magnetic cells D can be a row paring (i.e. along the row direction R) as indicated by the dashed outline $PP_1$, a column paring (i.e. along the column direction C) as indicated by the dashed outline $PP_2$, a diagonal paring (i.e. with dummy magnetic cells D positioned diagonally with respect to the memory cell P) as indicated by the dashed outline $PP_3$, or any combination of $PP_1$, $PP_2$, and $PP_3$.

The diagonal paring $PP_3$, the column paring $PP_2$, and the row paring $PP_1$, (or a combination thereof) can also result in a symmetrical surrounding of some or all of the magnetic memory cells P that have the perimeter positions $P_A$ as illustrated in FIG. 10 and described above in reference to FIG. 9 (see $SS_1$, and $SS_2$).

The column paring $PP_2$, and the row paring $PP_1$, can also result in the formation of one or more row or column banks (25, 27) as was described above in reference to FIGS. 7 and 8.

In FIG. 10, the easy axes E (not shown) of the dummy magnetic cells D and the magnetic memory cells (I, P) can be colinear with either one of the row or column directions (R, C). On the other hand, the easy axes E (not shown) of the dummy magnetic cells D and the magnetic memory cells (I, P) can be substantially colinear with a vector V (see FIG. 12). The vector V can be an angle measured with respect to the row or column directions (R, C) or it can be an angle measured with respect to any preselected point of origin relative to the array 20.

Figure 6A:
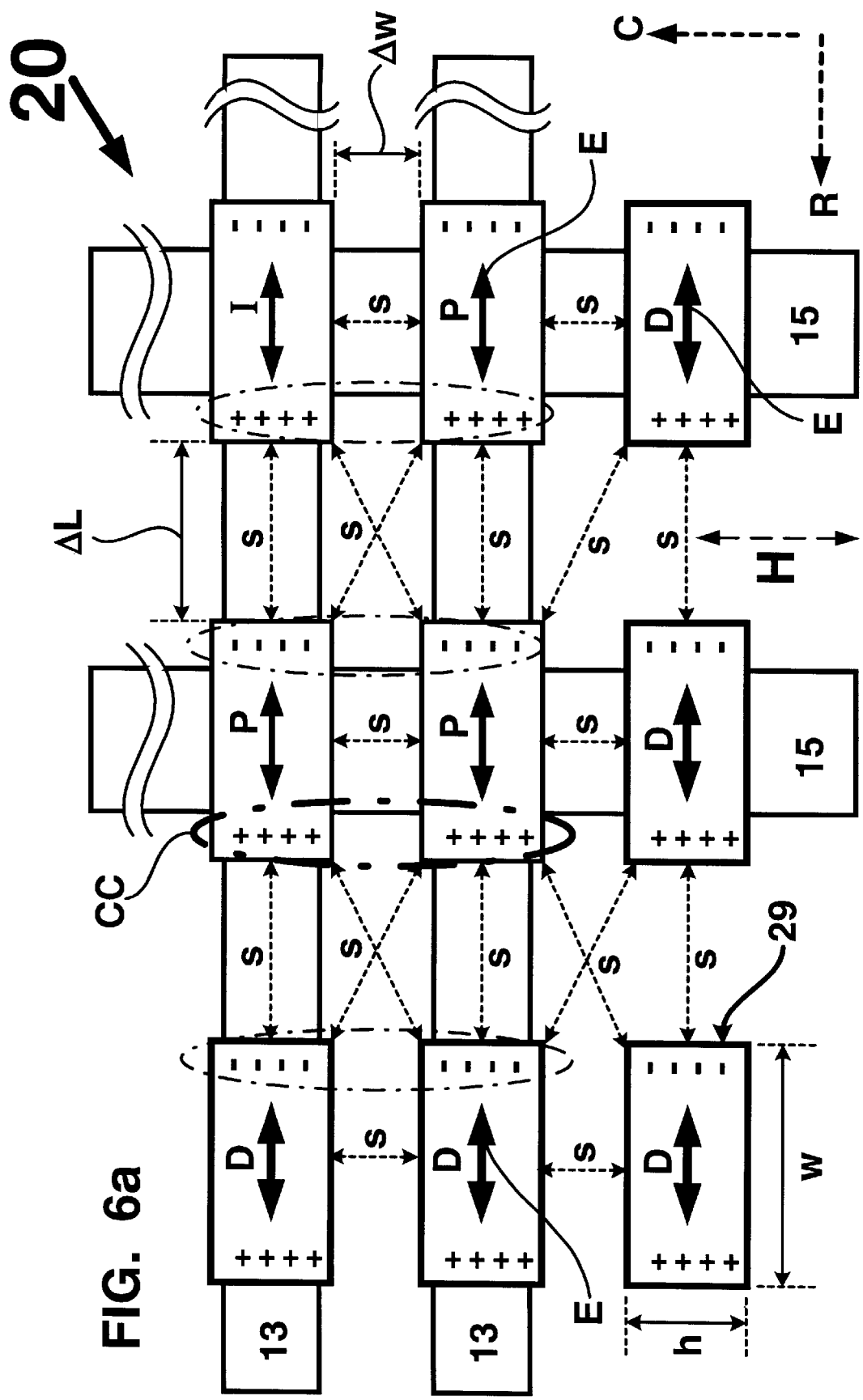
FIGS. 6a and 6b are schematic illustrations of a uniform magnetic environment for memory cells having a perimeter position at a row end or a column end respectively according to the present invention.
Figure 6B:
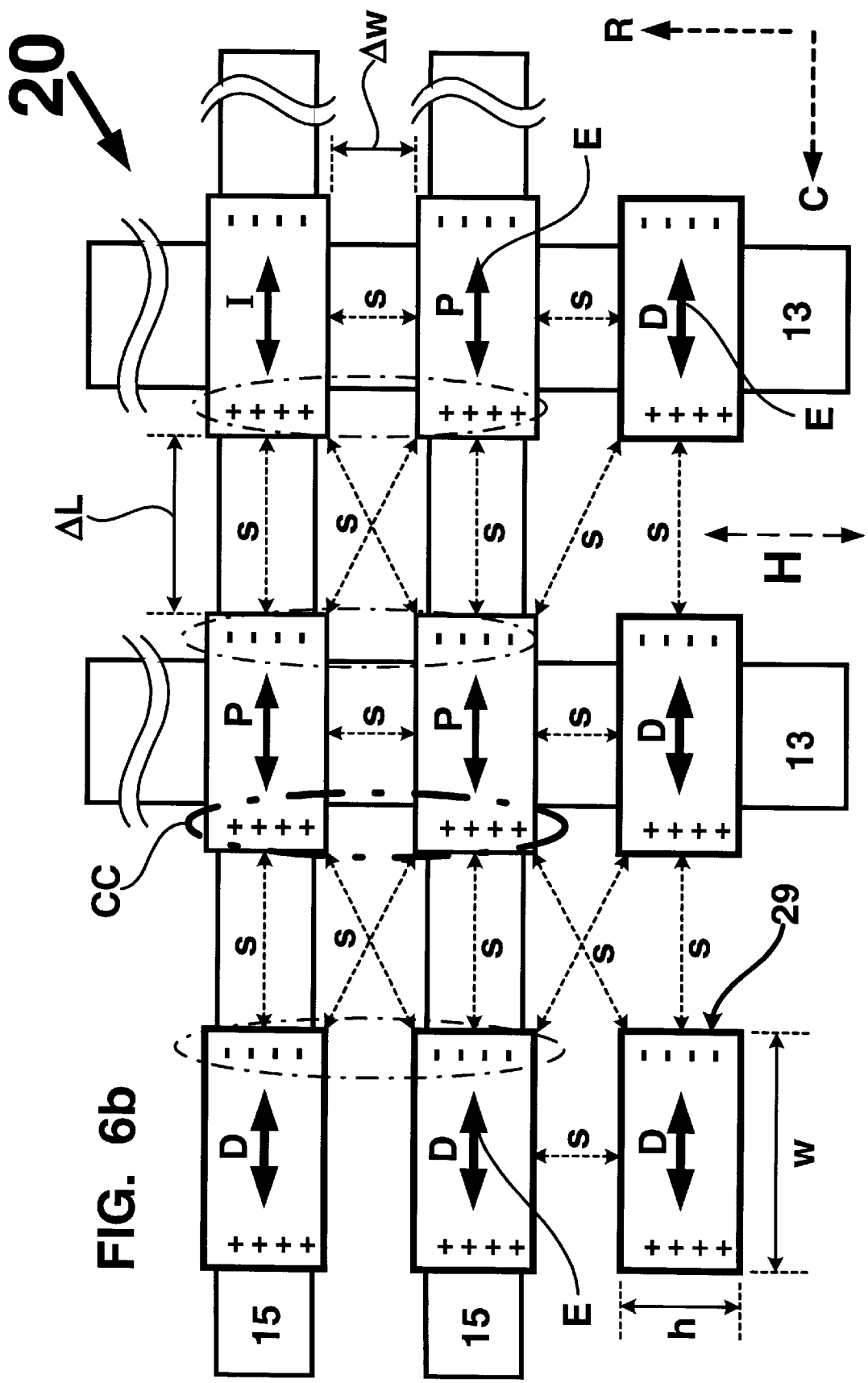

In FIGS. 6a and 6b, the placement of the dummy magnetic cells D to achieve the second uniform magnetic field is illustrated in reference to a portion of the array 20. It is well understood in the MRAM art that in order to overcome shape anisotrophy, a width to a height ratio of a magnetic memory cell should be greater than 1.0 (i.e. the cell should have an aspect ratio that is greater than one). To that end, the easy axis E of the dummy magnetic cells-D and the magnetic memory cells (I, P) can be set to align along a width dimension of the cell. In FIGS. 6a and 6b, a width w and a height h (see dummy magnetic cell 29) of the dummy magnetic cells D and the magnetic memory cells (I, P) is selected to provide an aspect ratio (w / h) that is greater than 1.0. Preferably the aspect ratio is about 3.0 such that the cell is much longer in the w dimension than it is tall in the h dimension.

With the easy axis E aligned with the row direction R (see FIG. 6a) or with the column direction C (see FIG. 6b) a magnetic pole (+) on the magnetic memory cells P that have the perimeter positions $P_A$ is compensated for (see dashed outline CC) it by a matching magnetic pole (-) on an adjacent dummy magnetic cell D that is positioned on the row (FIG. 6a) or on the column (FIG. 6b), or vice versa. Because the alterable orientation of magnetization (not shown) of the cells (I, P) is along the easy axis E (in either direction as indicated by the double arrows), the affect of the switching field of any given memory cell (I, P) is strongest along the easy axis E and is weakest in a direction that is transverse (i.e. 90 degrees) to the easy axis E. The transverse direction is also called a hard axis H. For instance, when the easy axis E is aligned with the row direction R, the hard axis H is aligned along the column direction C, and when the easy axis E is aligned with the column direction C, the hard axis H is aligned along the row direction R.

The strength of the switching field increases substantially as a distance $\Delta L$ between the memory cells (I, P) decreases along the easy axis E. The strength of the switching field increases to a lesser extent when a distance $\Delta W$ between the memory cells (I, P) decreases along the hard axis H. Therefore, to a first order, the most beneficial placement of the dummy magnetic cells D is at the end of a row or column that is aligned with the easy axis E as is shown in FIGS. 6a and 6b.

Accordingly, to balance the switching characteristics across the array 20, the dummy magnetic cells D can be positioned at the end of a row 13 with their easy axis E aligned with the easy axis E of the magnetic memory cells P that have the perimeter positions $P_A$ as shown in FIG. 6a. As a result, the magnetic poles along the easy axis are compensated for and the second uniform magnetic field is substantially identical to the first uniform magnetic field.

On the other hand, to balance the switching characteristics across the array 20, the dummy magnetic cells D can be positioned at the end of a column 15 with their easy axis E aligned with the easy axis E of the magnetic memory cells P that have the perimeter positions $P_A$ as shown in FIG. 6b. As a result, the magnetic poles along the easy axis are compensated for and the second uniform magnetic field is substantially identical to the first uniform magnetic field.

In FIGS. 6a and 6b, the memory cells P (see dashed outline CC) are balanced along the easy axis E on the left side by the dummy magnetic cells D and on the right side by either one of the memory cells (I, P).

To provide additional symmetry in the magnetic environment surrounding the magnetic memory cells P that have the perimeter positions $P_A$, the dummy magnetic cells D can be placed at diagonal locations (see reference numeral 29) as was described above.

Figure 11:
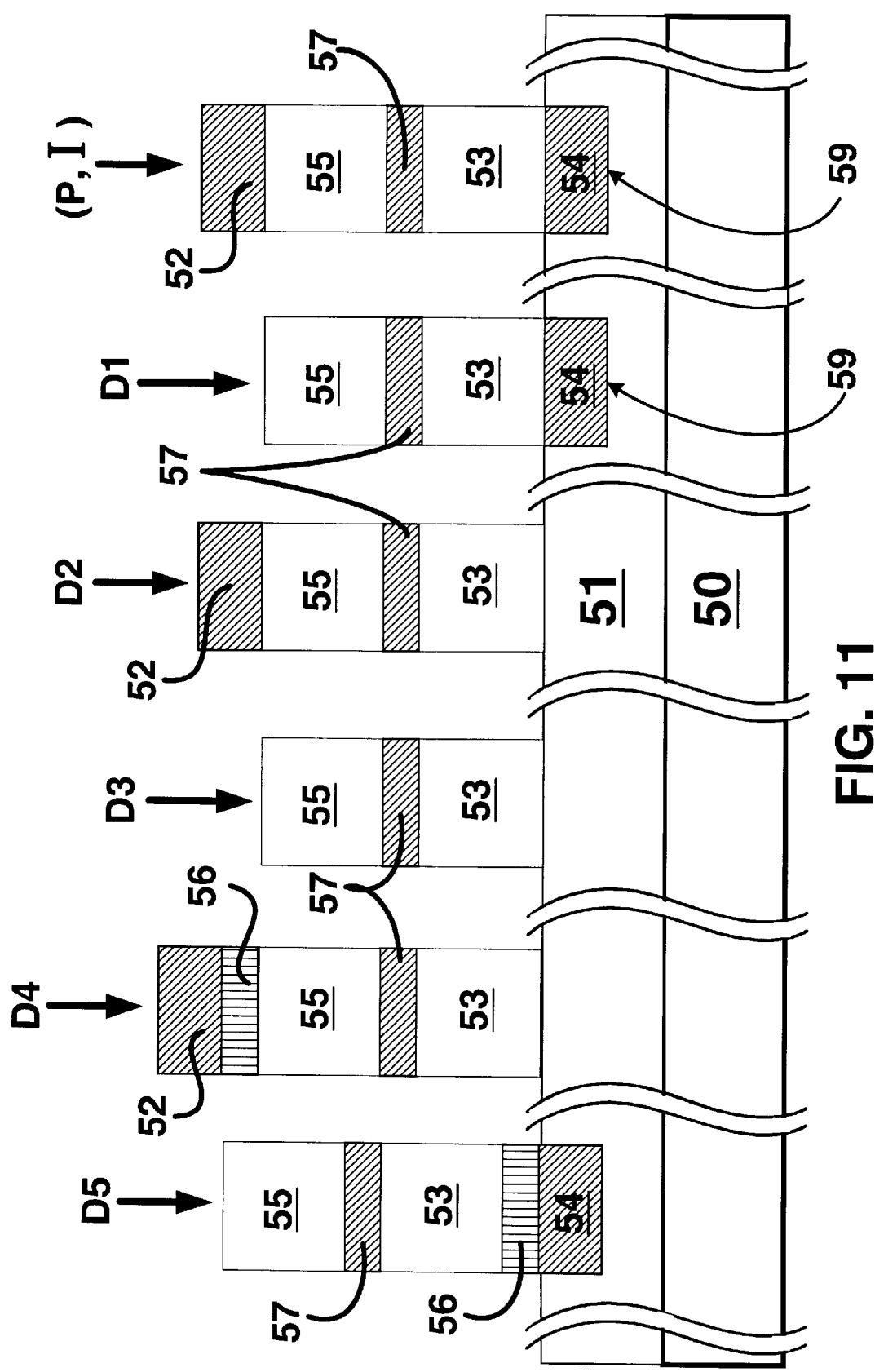
FIG. 11 is a cross-sectional view of magnetic memory cells and dummy two magnetic cells according to the present invention.

The magnetic memory cells (I, P) and the dummy magnetic cells D can be formed using microelectronic processes that are well known in the semiconductor processing art. In FIG. 11, a substrate 50 such as a silicon (Si) substrate can include a plurality of the magnetic memory cells (I, P) and the dummy magnetic cells D. A dielectric layer 51 (such as $SiO_2$) can be deposited on the substrate 50. A damascene process can be used to form a trench 59 in which a first conductor 54 is deposited and then planarized to form either one of the row or column conductors (13, 15). Next, the various layers of a memory cell (I, P, or D1) are formed over the conductor 54. The memory cell (I, P, or D1) can include one or more layers that form a pinned reference layer 53, one or more layers that form a thin tunneling barrier layer 57, and one or more layers that form a data layer 55. For the memory cells (I, P), a second conductor 52 is deposited to form either one of the row or column conductors (13, 15). The second conductor 52 is not deposited on the dummy magnetic cell D1. Therefore, the dummy magnetic cell D1 is crossed only by the first conductor 54.

On the other hand, a dummy magnetic cell D2 can be formed on the planarized dielectric layer 51. After formation of the layers 53, 57, and 55, the second conductor 52 is deposited so that the dummy magnetic cell D2 is crossed only by the second conductor 52.

Alternatively, a dummy magnetic cell D3 can be formed on the planarized dielectric layer 51. The dummy magnetic cell D3 is not crossed by the first and second conductors (54, 52). This configuration can be used for the diagonally placed dummy magnetic cells D (see reference numeral 29 in FIGS. 6a, 6b, and 9).

In yet another configuration, a dummy magnetic cell D4 can be formed on the planarized dielectric layer 51. The dummy magnetic cell D4 is crossed by the first at conductor 52 and a dielectric material 56 electrically isolates the dummy magnetic cell D4 from the first conductor 52. Similarly, a dummy magnetic cell D5 can be crossed by the second conductor 54 and a dielectric material 56 electrically isolates the dummy magnetic cell D5 from the second conductor 54. The dielectric material 56 can be a layer of a dielectric material such as silicon oxide ($SiO_2$), for example. This configuration can be used for any of the embodiments described herein including the diagonally placed dummy magnetic cells D (see reference numeral 29 in FIGS. 6a, 6b, and 9).

Although several embodiments of the present invention have been disclosed, and illustrated, the invention is not limited to the specific forms or arrangements of parts so described and illustrated. The invention is only limited by the claims.

What is claimed is:

1. A magnetic memory with a uniform magnetic environment, comprising:
   a plurality of magnetic memory cells having an easy axis and arranged in a plurality of rows and columns to define an array, the magnetic memory cells are positioned at a selected one of an interior position or a perimeter position within the array, and
   wherein the magnetic memory cells having the interior position are exposed to a first uniform magnetic environment created by adjacent magnetic memory cells;
   a row conductor and a column conductor that cross the magnetic memory cells in a row direction and a column direction respectively; and
   a plurality of dummy magnetic cells having an easy axis and positioned adjacent to a selected one or more of the magnetic memory cells having the perimeter position, and
   wherein the magnetic memory cells having the perimeter position are exposed to a second uniform magnetic environment created by adjacent magnetic memory cells and adjacent dummy magnetic cells, and the second uniform magnetic environment is substantially equal to the first uniform magnetic environment.

2. The magnetic memory as set forth in claim 1, wherein the first uniform magnetic environment affects a magnitude of a switching field generated by the magnetic memory cells having the interior position and the adjacent magnetic memory cells, and wherein the second uniform magnetic environment affects a magnitude of a switching field generated by the magnetic memory cells having the perimeter position, the dummy magnetic cells, and the adjacent magnetic memory cells in substantially the same manner as the first uniform magnetic field.

3. The magnetic memory as set forth in claim 1, wherein the easy axis of the magnetic memory cells and the easy axis of the dummy magnetic cells are substantially colinear with one another.

4. The magnetic memory as set forth in claim 3, wherein the easy axis of the magnetic memory cells and the easy axis of the dummy magnetic cells are substantially colinear with the row direction.

5. The magnetic memory as set forth in claim 4, wherein the dummy magnetic cells are positioned adjacent to the magnetic memory cells that are positioned on the rows and that have the perimeter position.

6. The magnetic memory as set forth in claim 5, wherein the dummy magnetic cells are arranged in at least one row bank and the dummy magnetic cells within the row bank are paired with the magnetic memory cells that have the perimeter position.

7. The magnetic memory as set forth in claim 3, wherein the easy axis of the magnetic memory cells and the easy axis of the dummy magnetic cells are substantially colinear with the column direction.

8. The magnetic memory as set forth in claim 7, wherein the dummy magnetic cells are positioned adjacent to the magnetic memory cells that are positioned on the columns and that have the perimeter position.

9. The magnetic memory as set forth in claim 8, wherein the dummy magnetic cells are arranged in at least one column bank and the dummy magnetic cells within the column bank are paired with the magnetic memory cells that have the perimeter position.

10. The magnetic memory as set forth in claim 3, wherein the easy axis of the magnetic memory cells and the easy axis of the dummy magnetic cells are substantially colinear with a vector.

11. The magnetic memory as set forth in claim 1, wherein the dummy magnetic cells are crossed by a selected one of the row conductor and the column conductor.

12. The magnetic memory as set forth in claim 1, wherein the dummy magnetic cells are crossed by a selected one of the row conductor and the column conductor and the dummy magnetic cells are electrically isolated from the selected one of the row conductor and the column conductor by a dielectric material.

13. The magnetic memory as set forth in claim 1, wherein the dummy magnetic cells are not crossed by the row conductor and the column conductor.

14. The magnetic memory as set forth in claim 1, wherein the dummy magnetic cells are positioned so that the magnetic memory cells having the perimeter position are symmetrically surrounded by the dummy magnetic cells and adjacent magnetic memory cells.

15. The magnetic memory as set forth in claim 14, wherein the dummy magnetic cells are not crossed by the row conductor and the column conductor.

16. The magnetic memory as set forth in claim 14, wherein the dummy magnetic cells are crossed by a selected one of the row conductor and the column conductor and the dummy magnetic cells are electrically isolated from the selected one of the row conductor and the column conductor by a dielectric material.

17. The magnetic memory as set forth in claim 1, wherein a selected one or more of the memory cells having the perimeter position are paired with at least two of the dummy magnetic cells.

18. The magnetic memory as set forth in claim 17, wherein the magnetic memory cells having the perimeter position have a paring that is a selected one or more of a row paring, a column paring, and a diagonal paring.

19. The magnetic memory as set forth in claim 18, wherein the pairing results in a formation of a selected one or more of a symmetrical surrounding of the memory cells having the perimeter position, a row bank positioned adjacent to the memory cells having the perimeter position, and a column bank positioned adjacent to the memory cells having the perimeter position.

* * * * *